United States Patent [19]
Yenni, Jr. et al.

[11] Patent Number: 5,869,412
[45] Date of Patent: Feb. 9, 1999

[54] METAL FIBERMAT/POLYMER COMPOSITE

[75] Inventors: Donald M. Yenni, Jr., Round Rock; Robert L. Lambert, Jr., Georgetown, both of Tex.; Clyde D. Calhoun, Stillwater, Minn.; David C. Koskenmaki, St. Paul, Minn.; David J. Lundin, Woodbury, Minn.

[73] Assignee: Minnesota Mining & Manufacturing Co., St. Paul, Minn.

[21] Appl. No.: 748,708

[22] Filed: Aug. 22, 1991

[51] Int. Cl.$^6$ ............................................ B32B 17/00
[52] U.S. Cl. ............................................ 442/376; 428/903
[58] Field of Search ............................ 428/284, 285, 428/903; 174/35

[56] References Cited

U.S. PATENT DOCUMENTS

| | | | |
|---|---|---|---|
| 3,565,127 | 2/1971 | Nicely et al. | 139/426 |
| 3,727,292 | 4/1973 | Nicely | 29/419 |
| 4,678,699 | 7/1987 | Kritchevsky et al. | 428/175 |
| 4,689,098 | 8/1987 | Gaughan | 428/285 |
| 4,973,514 | 11/1990 | Gamble et al. | 428/297 |
| 4,983,452 | 1/1991 | Daimon et al. | 428/287 |
| 5,068,142 | 11/1991 | Nose et al. | 428/903 |

FOREIGN PATENT DOCUMENTS

| | | | |
|---|---|---|---|
| 0 369 639 A2 | 5/1990 | European Pat. Off. | B22B 15/02 |
| 62-176823 | 8/1987 | Japan | B29C 51/14 |
| 90-276297 | 11/1990 | Japan | H05K 9/00 |

*Primary Examiner*—Thurman K. Page
*Assistant Examiner*—Kathryne E. Shelborne
*Attorney, Agent, or Firm*—Darla P. Fonseca

[57] ABSTRACT

A thermoformable add-on EMI shielding sheet comprising a carrier material selected from polymeric films and fibrous webs having the capability of becoming porous when thermoformed, having a metal mat at least partially embedded therein, comprising a plurality of fine, randomly-oriented metal fibers, the carrier material having a softening temperature lower than the highest temperature reached during the thermoforming process.

19 Claims, No Drawings

METAL FIBERMAT/POLYMER COMPOSITE

BACKGROUND OF THE INVENTION

1. Field of the Invention

This invention relates to non-woven mats of randomly oriented metal fibers, to metal/polymer composites formed with such mats, and particularly to thermoformable metal/polymer composites.

2. Description of the Related Art

A variety of composites containing both metal and polymeric materials are known for use in many varied applications. One important use for a metal/polymer composite is as a shield for electromagnetic and radio frequency waves. The interference caused by such waves in electronic devices is commonly referred to as electromagnetic interference (EMI) or radio frequency interference (RFI), hereinafter jointly referred to as EMI. EMI shielding is often placed around an EMI source to prevent it from radiating EMI and interfering with surrounding devices. Also, the devices themselves may be provided with EMI shielding in an effort to shield the device from incoming electromagnetic radiation.

Another important use for such composites is for the protection of sensitive electronic parts from static charges. Static charge build-up can result from, e.g., the triboelectrification of surfaces, and can lead to high electrical potentials. A sensitive electronic part that may come into proximity or contact with a statically charged surface can be damaged or destroyed. During shipping or handling, shielding of an electronic part from static electricity can be accomplished by placing the part in an electrically conductive metal or metal/polymer container, with the metal providing a shielding or Faraday cage-like surface to protect against static fields. Many applications require that the shielding be thermoformed into a particular shape or structure. A thermoforming process comprises heating the material and forming it into the desired shape. For example, thermoforming is used to make various types of containers or housings. Conventional thermoforming is usually accomplished by heating a thermoplastic sheet above its softening point, and forcing it against a mold by applying vacuum, air pressure and/or mechanical pressure. When the sheet is cooled, the contour of the mold is reproduced in detail.

It is possible to provide thermoformable articles with properties of EMI shielding. The methods used are, however, time consuming and relatively expensive. One reason for this is that metal cladding generally occurs after the shape or structure has been thermoformed, requiring a separate, secondary operation. Environmental concerns also exist due to some processing byproducts. Also, such coatings tend to chip or peel off after aging, thereby limiting their use as EMI shields.

Metal/polymer composites having continuous coatings of metal deposited by sputtering, arc spraying, vapor deposition or the like are known in the art.

U.S. Pat. No. 3,272,292, (Nicely), discloses a non-woven unitary metallic sheet which is fabricated by extruding a molten stream from a metallic melt into an atmosphere which reacts to form a stabilizing film about the periphery of the metal stream. The spun metal filaments are allowed to solidify, and then collected as a nonwoven fibrous mass. The mass of filaments are then compressed into a sheet-like form, and given strength by binding all or selected adjacent fibers together.

U.S. Pat. No. 3,565,127, (Nicely et al.) discloses a composite yarn structure comprising strands of brittle filamentary materials collimated into a bundle and having a wrapped or braided covering applied to hold the bundle as a unit until further processing. The filamentary materials may be selected from inorganic refractory fibers such as carbon, boron, quartz, silicon carbide, and the like. Filling yarns for weaving the bundle may be made from a large variety of high-modulus, high-strength materials.

An alternative to continuous metal coatings is a high loading of short, straight, staple metal fibers either mixed within the thermoplastic sheet material or coated across its surface. The effectiveness of the EMI shielding is related to the overall electrical conductivity of the metal/polymer composite, with higher electrical conductivity typically giving better EMI shielding. When electrical conductivity is obtained by mixing conductive fibers into the volume of a polymer or forming a coating of those fibers on the surface of the polymer, the overall conductivity is dependent on the individual conductivity of the fibers as well as the number of electrical contacts between said fibers. Short staple conductive fibers require higher concentrations in order to obtain sufficient electrical contact between the fibers. High loading of metal fibers tends to adversely affect the physical properties of the final metal/polymer composite. With any conductive fiber, the number of contacts is significantly reduced, as the polymer containing them is stretched, during the thermoforming process, which causes a concurrent reduction in the EMI shielding.

U.S. Pat. No. 4,678,699, (Kritchevsky et al.), discloses a stampable thermoplastic composite having at least one thermoplastic layer and at least one shielding layer, the composite having an EMI/RFI shielding effectiveness of at least 30 dB. In one embodiment the shielding layer may be a knitted wire mesh or screen. The shielding layer may be adjacent to the thermoplastic layer, or it may be embedded into the thermoplastic layer.

Another alternative is the use of metal coated polymeric fibers in place of solid metal fibers in filled or coated plastics for EMI shielding. These composites provide reduced weight and some cost savings over their solid metal fiber filled counterparts. However, they have significantly reduced EMI shielding properties when compared to solid metal fibers. This reduction is due to the electrically conductive surface of the fibers being typically destroyed as they are deformed or stretched with the thermoformed substrate.

Another alternative to continuous metal coatings applied after the thermoforming operation is the use of blanks (section of polymeric substrate purchased by the thermoformer from his extruder supplier) that have been prepared from various metal laminates. The metal layers in such preassembled blanks consist of anything from thin foils to fibrous coatings. These materials are usually incapable of withstanding the severe dimensional changes, i.e., up to 300% elongation, during the thermoforming process. Usefulness of such materials in EMI shielding applications requiring a thermoformed article are therefore highly dependent on the ductility of the metal used. See, e.g., U.S. Pat. No. 4,689,098 (Gaughan).

JAP 1990-276297 discloses molded EMI shielding sheets prepared by arranging narrow long metal fibers in a mat, adhering synthetic resinous films over top and bottom of the mat, and then vacuum forming. The long metal fibers are disclosed to reduce the chance of puncture of the synthetic resin films. Between the film layer and the metal mat, a nonwoven cloth made from synthetic resins may be layered. The nonwoven web is then entangled with the metal fibers by needle punching both mutually, and film layers are then sandwiched on both sides of the cloth, and the article is vacuum formed.

JP62-176823, published Aug. 3, 1987 discloses compression molding of a thermoforming laminated sheet consisting of alloys with high plasticity and thermoforming resins wherein a lower pressure is applied initially and the pressure is gradually increased as the molding continues. This process is disclosed to reduce cracking and peeling of the final thermoformed article.

Several alternative solutions have been attempted to improve the effectiveness of conductive fiber based EMI shielding. Forming pressure welds or sintered bonds between the fibers improves electrical conductivity, but reduces overall flexibility and extensibility of the welded mat. A sintered or otherwise bonded metal-fiber/polymer composite sheet cannot be thermoformed except at stresses which would break the fibers themselves, the bonds between the fibers or both, thus drastically reducing the shielding properties.

Electrical conductivity could be enhanced in conductive fiber filled or coated composites by using longer fibers that would require fewer fiber-fiber contacts to maintain continuous electrical conductivity. However, since metal fibers in their solid state stretch little, if at all, under thermoforming conditions, the fibers must slip relative to the polymer to keep from breaking during the thermoforming process. The fiber changes its shape during the deformation of the polymer matrix. The net effect is a dramatic increase in the thermoforming stress required for plastic flow of the composite which again would break the fibers themselves, the bonds between the fibers or both. Also, at concave surfaces or corners, the fibers may pull free of the surface.

Additionally, baffles are often used within the heating chamber of the thermoforming machine to preferentially heat certain areas of the substrate polymer to be thermoformed to aid in wall thickness control of the final article. Any metallic layer contained within the sheet will disturb the heating characteristics of the sheet during the heating cycle. Such reflective and absorptive interference with the desired heating pattern are unavoidable when using EMI shielding laminates and compositions of the prior art.

Contrary to what might be expected, the amount of EMI that passes through a given void is dependent on the length of the void's longest dimension, and not on the total area of the void. For illustration, a 1.00 mm by 1.00 mm void (area=1.00 mm$^2$) is believed to let less EMI pass through than would a 3.0 mm by 0.05 mm void (area=0.15 mm$^2$) even though the 1.00 mm$^2$ space has greater than six times the area of the 0.15 mm$^2$ space. This is sometimes called "the slot effect".

Accordingly, even extremely thin openings must be avoided where the opening has a substantial longitudinal dimension. A multi-part EMI shielded enclosure can be effectively sealed without leaving thin cracks between adjacent enclosure parts by providing conductive surfaces on adjacent surfaces of the shielded enclosure. For this reason it is not always highly effective to simply extrude or laminate fibers, particles, or flakes of metal into bulk polymer. The metal must preferably be distributed throughout the polymer to specifically include the sealing surfaces or at least be accessible for electrical connection to the opposing surfaces by way of special gaskets or electrical connectors.

Additionally, sheets of the prior art made for the purpose of providing EMI shielding as removed directly from the thermoforming machine (e.g. one step shielding) require that the entire thermoformable blank contain the metal laminate or shielding layer throughout. This results in excess cost for unused shielding material since these blanks are typically sold in large rectangular sections. Also, the resulting edge trim (the portion of the material not included in the final thermoformed article) from such material cannot be ground up and reused since it is contaminated with the metallic filler.

Accordingly, there is a need for an add-on EMI or static shielding sheet material which can be placed onto a thermoformable polymeric substrate solely in those areas which are to be shielded. Additionally, there is a need for a material which will reduce cost and increase processability, allowing the thermoformer to conveniently and cost effectively provide shielding for specific thermoformable articles in large scale production as well as in limited prototype configurations.

Such a thermoformable add-on EMI shielding sheet also must not entrap significant amounts of air between itself and the substrate polymer material in order to reduce the propensity of the conductive add-on coating to break free from the polymeric substrate during removal from the thermoforming equipment or during subsequent handling and use of the thermoformed article. In addition, such pockets of air will tend to expand under the heat of the thermoforming operation and burst causing large holes to be formed in the EMI shield severely compromising its effectiveness.

It has now been discovered that a polymeric carrier material which is either porous or capable of becoming porous during the thermoforming process, and having a metal mat at least partially embedded therein comprising a plurality of fine, randomly-oriented metal fibers, wherein the carrier material softens and the metal fiber mat has a melting temperature lower than the maximum thermoforming temperature provides such an add-on sheet.

Preferred add-on sheets function without requiring masking of cosmetic surface areas of the thermoformed article, a separate process which is required prior to applying conductive paint. Also eliminated is the necessity for repainting decorative areas of the thermoformed article such as is required when arc spraying or plating procedures are used.

Preferred add-on EMI shielding materials provided herein do not affect the preferential heating characteristics of the polymeric substrate blank and will not increase significantly the cycle time for thermoforming. The material also reduces waste by allowing edge trim to be reground for reuse by the extruder.

SUMMARY OF THE INVENTION

The present invention provides a thermoplastic add-on EMI or static shielding sheet which can be cut to size by the thermoformer in order to provide shielding solely in those areas where it is desired.

The invention comprises a thermoformable add-on EMI shielding sheet comprising a carrier material selected from polymeric sheet material and fibrous webs which are porous or have the capability of becoming porous during a thermoforming process, the carrier material having a metal mat at least partially embedded therein comprising a plurality of fine, randomly-oriented metal fibers, wherein the carrier material has a softening temperature lower than the highest temperature reached during said thermoforming process.

The invention also provides a thermoformable article comprising the add-on EMI shielding sheet, and a substrate polymer, wherein the thermoforming temperature of the entire article is higher than the melting onset temperature of the metal fibers.

The invention reduces the costs of EMI shielding to a thermoformer by allowing the thermoformer to cut the add-on EMI shielding sheet to the size and shape of the area to be shielded. The remainder of the polymeric substrate blank can be cut away during a trimming operation, subsequent to thermoforming, and reground for reuse. Since the invention may be added to the polymeric substrate during the thermoforming operation, the invention results in a one step EMI shielding and thermoforming process. The invention may be added after the substrate polymer has been preheated, if desired, so that any preferential heating characteristics of the polymer substrate blank are not significantly disrupted nor is the cycle time for the operation excessively increased.

The add-on EMI shielding sheet of this invention is sufficiently porous, or capable of becoming porous during the thermoforming process to prevent entrapment of significant amounts of air between the sheet and the polymeric substrate during the process of forming a thermoformed article.

In preferred embodiments of the invention, the carrier material is a porous nonwoven web, most preferably comprising melt blown fibers. These nonwoven fibers are intertwined with randomly oriented metal fibers into a sheet like material.

In an alternative embodiment of the invention, the carrier material is a thin polymeric film, said film having the property of becoming porous during the thermoforming process.

A further embodiment of the invention utilizes a thin-film polymeric carrier material which includes mechanical perforations in sufficient numbers to render it sufficiently porous for the purpose of gas expulsion during the thermoforming operation.

The thermoformable article of the present invention may be stretched to at least 20%, preferably at least about 300% of its original dimensions, at least in certain regions of the composite, without loss of electrical continuity.

The present invention also provides a method of making an EMI or static shielding thermoformed article comprising the steps of:
  a) providing a polymeric substrate having an area where EMI shielding is desired;
  b) heating said polymeric substrate for a sufficient time for it to attain some portion of its thermoforming temperature,
  c) forming an article by placing a precut add-on EMI shielding sheet comprising a carrier material including its metal mat over said area where EMI shielding is desired;
  d) heating said article for a sufficient time for said carrier material to soften and said metal mat to melt and for said article to reach completely its thermoforming temperature;
  e) thermoforming said article into a desired shape.

The invention also provides an alternative method for making an EMI or static shielding thermoformed article comprising the steps of:
  a) providing a polymeric substrate having an area where EMI shielding is desired;
  b) forming an article by placing a precut add-on EMI shielding sheet comprising a carrier material including its metal mat over said area where EMI shielding is desired;
  c) heating said article for a sufficient time for said carrier material to soften and said metal mat to melt and for said article to reach completely its thermoforming temperature;
  d) thermoforming said article into a desired shape.

As used herein, the terms below have the following meanings.

1. The terms "polymeric substrate" and "substrate polymer" are used interchangeably herein and mean a polymer such as ABS (acrylonitrile-butadiene-styrene) which is thermoformed. This material has no EMI shielding properties until thermoformed with the add-on EMI shielding sheet, defined below.

2. The terms "carrier material" and "porous carrier material" refer to the thermoplastic material in which the metal fibers are embedded or entangled to form the add-on EMI shielding sheet. The carrier material may consist of a film or fiber mat wherein multiple polymers, a single polymer, or a blend of polymers are used. More than one layer of carrier material may be used. The material may be porous prior to the thermoforming operation, or may become porous during the operation.

3. The term "add-on EMI shielding sheet" means a sheet comprised of a carrier material and metal fibers wherein the carrier material softens and the metal fibers melt below the thermoforming temperature of the thermoformable article.

4. The term "thermoformable article" denotes the combination of the substrate polymer and the add-on EMI shielding sheet.

5. The term "partially embedded" means that a portion, less than the entirety, of the metal fiber protrudes above the surface of the carrier in which it is located.

6. The term "completely embedded" means that none of the metal fiber protrudes above the surface of the carrier in which it is located. It is either at the surface of the carrier material or below it.

7. The term "porous" as used herein to describe the carrier material of the invention means penetrable by gas, such that significant amounts of air or other gases present during the thermoforming process are not entrapped by the carrier material, causing bubbles to form between the carrier material and the substrate polymer.

8. The term "metal" as used herein includes an elemental metal or a metal alloy, as defined in the ASM Metals Handbook, Eighth Edition, Volume 1, Properties and Selection of Metals.

9. The terms "metal mat" and "mat of metal" means a mat of fine randomly oriented metal fibers having multiple points of intersection.

DETAILED DESCRIPTION OF THE INVENTION

The carrier material used in conjunction with the mat of randomly-oriented metal fibers may be selected from a wide variety of porous nonwoven and polymeric materials, dependent on the desired end use of the add-on EMI shielding sheet, and desirable properties of the final thermoformed article. The carrier may be a single sheet-like material. The carrier material may also comprise multiple layers of materials or mixtures of fibers made of various different materials to include special physical, thermal or polymeric substrate adhesion properties.

A useful carrier material is porous, or is capable of becoming porous upon thermoforming. Some sheet materials may exhibit porosity only when utilized as very thin-films. If the film is too thick, it will not be porous, and the final thermoformed article may have air entrapment between the add-on EMI shielding sheet and the polymeric substrate. The necessary porosity may be inherent in the material, or may be mechanically induced, as with thicker films. A useful carrier material will also soften at a temperature lower than the maximum thermoforming temperature, and is preferably nonflammable when combined with metal fibers and the polymeric substrate into the final article.

Although not wishing to be bound by theory, it is believed that during thermoforming, the porous nature of the carrier material in conjunction with the non-woven metal mat allows undesired gas to escape through the add-on EMI shielding sheet. If the add-on thermoforming material is nonporous, the gas does not diffuse through the shielding sheet. It then becomes entrapped between the shielding sheet and polymer substrate layer causing large pockets of air or bubbles which will either result in pieces of the add-on shielding layer coming off during subsequent handling or use of the thermoformed part, or burst, causing holes in the EMI shield.

Examples of polymeric materials useful as carrier materials include, but are not limited to, ethylene-butyl acrylate copolymers, ethylene-vinyl acetate copolymers, ethylene-methacrylic acid copolymers; thermoplastic polyesters, e.g., "6763 PETG", available commercially from Eastman Chemical, "Bynel CXA" resins, available commercially from E. I. duPont de Nemours (DuPont); "DAF" 801, and "DAF 919", available commercially from Dow Chemical Company; polyamides, or blends thereof, and the like.

A wide variety of metals and metal alloys may be used in add-on EMI sheets of the invention. A useful metal has a melting temperature in the range of 70° C. to about 370° C. depending on the substrate polymer. Most metal alloys however, do not have a single melting point, rather they melt over a range of temperatures. For purposes herein, the melting temperature, "melting range onset", or "melting onset temperature" refer to the temperature at which the metal or alloy begins to melt, and does not necessarily refer to a temperature at which the entirety of the metal used is molten. Metals with melting onset temperatures below about 70° C. may tend to become distorted during storage of the finished thermoformed articles, as well as during exposure to typical in-use temperatures such as might be experienced on the surface of electronic equipment housings. The metals having higher melting onset temperatures may be used with polymeric substrates such as polyethersulfones which exhibit thermoforming temperatures of approximately 371° C. Carrier polymers must be selected by one skilled in the art so that they will not degrade at the thermoforming temperatures required for the article.

During thermoforming of the final article, the metal begins to melt and is distorted or stretched along with the carrier material. As the metal mat is stretched, the molten metal strands retain continuity. Metal fiber-to-fiber contacts remain intact and are fused together, improving electrical conductivity.

Strain limits of individual sheets vary, depending on factors such as the metal fiber diameter, the amount of carrier material present to support the metal fibers and the surface tension of the molten metal fibers relative to that of the carrier. If the strain limit is exceeded the fibers of the metal mat within the add-on EMI shielding sheet may tend to break or bead up resulting in loss of electrical continuity.

Examples of relatively low melting metals for use in the composite of the present invention include tin, lead, bismuth, cadmium, indium, gallium, zinc, mixtures thereof, and their alloys. The alloy group may be augmented by alloys containing metals with higher melting points, including such metals as antimony, aluminum, copper, silver, gold, nickel, cobalt, and iron. Those skilled in the art will also be able to select other alloys to fulfill the requisite melt temperature criterion.

The add-on EMI sheet is made by combining the carrier material with the mat of metal fibers in such a manner that the mat is at least partially embedded into the carrier materials. This is accomplished by varied methods, depending on the nature of the carrier material. For example, a non-woven carrier material may be combined with the mat of metal fibers by embedding the mat into the carrier material by such methods as heating the carrier material to a softened condition and laminating the mat and carrier together, or by application of mechanical pressure or a combination thereof. The non-woven fibrous carrier material may also be mixed in with the metal fibers to form a metal/polymer nonwoven matrix sheet which itself forms the add-on EMI shielding sheet. This sheet can, if desired, be pressed together for improved handling by the application of heat, pressure or a combination thereof.

Alternatively, if the carrier material comprises one or more sheet materials, the mat of metal may be partially or completely embedded into a single sheet or between multiple sheets by mechanical pressure or by heating the carrier to a softened condition and laminating the mat and carrier together, or by a combination of heat and pressure lamination.

The carrier material may comprise a film which softens below the melting onset temperature of the metal mat and which has a thickness of less than about the diameter of the metal fibers. The metal mat is partially or completely embedded into the film by heating the carrier material to a softened condition and laminating the mat and carrier together or by application of mechanical pressure or a combination thereof.

When the composite add-on EMI sheet is placed onto a polymeric substrate prior to thermoforming, air will initially be trapped between the polymeric substrate and the carrier film. As the add-on thermoformable sheet is heated during the thermoforming operation the carrier resin softens. In this softened condition, the carrier sheet is easily ruptured by the pressure of entrapped gas. These ruptures or "pores" will then allow air to escape.

In preferred embodiments of the invention, the mat is partially embedded into the carrier material, leaving exposed metal extending from the surface. The exposed metal provides a conductive surface on the carrier material. However, where electrical isolation of the conductive surface is desired, as in some static protective situations, or where added abrasion resistance of the shielding layer is preferred, the mat of metal should be completely embedded. Electrical contact in specified areas of the mat of metal will then require special connectors to access the metal layer.

The add-on EMI shielding sheet is utilized with a substrate polymer to yield a thermoformable article. Useful resins for the substrate polymer are thermoformable. Such materials will typically have a fractional melt index and significant "hot" strength or tensile elasticity. Lower melt index materials exhibit more viscous behavior when heated and stretched and greater "hot" strength than do higher melt index materials. The "hot" strength of the polymeric sheet will allow it to be shaped by low pressures while preventing excessive sagging or tearing. Other desirable properties are low shrinkage on cooling and a wide thermoforming temperature range. Other properties vary, depending on the manufacturing method and desired properties of the finished product.

The polymeric substrate is usually specified by the thermoformers'customer; the thermoformer may have little control over the identity of the polymer(s).

Suitable substrate polymer materials include but are not limited to: polystyrene, particularly high-impact polystyrene; cellulosic materials, e.g., cellulose acetate, cellulose-acetate-butyrate (CAB), and cellulose propionate; acrylonitrile-butadiene-styrene polymers (ABS); olefin polymers, e.g., polyethylene, ethylene-butene copolymers, ethylene-vinyl acetate copolymers, polypropylene, and propylene copolymers; methylmethacrylate copolymers; polycarbonate; vinyl chloride polymers, e.g., poly(vinyl chloride-co-vinyl acetate), poly(vinyl chloride); polysulfones; polyamides; polyethersulfones; fluorinated-ethylene-propylene and rigid and flexible vinyl foams.

The thermoforming process may stretch the heated thermoformable article, or a portion thereof, to at least about 20 percent, and often, at least about 300 percent of the original dimensions of the polymeric sheet. For, example, stretching of the substrate may be greater around corners than on planar surfaces.

To allow thermoforming of the final article without loss of electrical continuity or EMI shielding properties, the thermoforming temperature of the article, including the substrate polymer and the add-on EMI shielding sheet carrier material, must be higher than the melting onset temperature of the metal fibers. The softening point of the carrier material polymer may be higher than, lower than, or equal to the melting onset temperature of the metal fibers, but it is preferably less than or equal to the maximum temperature reached during thermoforming of the article.

Thermoforming temperatures of various materials are temperatures or a range of temperatures determined by one skilled in the art, and are frequently specified by the manufacturer in product literature.

The present invention also provides a method of making an EMI or static shielding thermoformed article comprising the steps of:

a) providing a polymeric substrate having an area where EMI shielding is desired;

b) heating said polymeric substrate for a sufficient time for it to attain some portion of its thermoforming temperature, c) forming an article by placing a precut add-on EMI shielding sheet comprising a carrier material including its metal mat over said area where EMI shielding is desired;

d) heating said article for a sufficient time for said carrier material to soften and said metal mat to melt and for said article to reach completely its thermoforming temperature;

e) thermoforming said article into a desired shape.

The invention also provides an alternative method for making an EMI or static shielding thermoformed article comprising the steps of:

a) providing a polymeric substrate having an area where EMI shielding is desired;

b) forming an article by placing a precut add-on EMI shielding sheet comprising a carrier material including its metal mat over said area where EMI shielding is desired;

c) heating said article for a sufficient time for said carrier material to soften and said metal mat to melt and for said article to reach completely its thermoforming temperature;

d) thermoforming said article into a desired shape.

These methods represent a vast improvement over prior methods of forming a thermoformed article having EMI shielding properties in several respects.

First, previous methods required that the EMI shielding material cover the entire substrate for thermoforming. The add-on sheet of the invention may be precut, and placed over only the area where shielding is desired. This is both convenient, and provides cost savings, since less shielding material is required for each application. The substrate polymer, not covered by the pre-cut add-on EMI shielding sheet, may also be trimmed and used as regrind, resulting in further savings.

The add-on EMI sheet need not be placed in the clamp frame of the vacuum forming machine prior to the majority of the pre-heating of the substrate polymer. This results in processing advantages (for thermoforming) in that thicker substrate polymers or substrate polymers that require preferential heating can be partially heated without the thermal reflective interference of the metallic EMI shielding surface and its effect on pre-heating time. The cycle time for thermoforming is therefore not significantly lengthened.

Also, the thermoformer is provided with a one-step ecologically desirable shielding technique as solvents and toxic materials required by many conventional shielding techniques, such as zinc-arc spraying and the like, are not required.

The porous carrier material prevents the entrapment of significant amounts of gases between the carrier material and the substrate polymer. Such entrapment of gases may result in de-lamination at the interface between these two layers either when removed from the thermoforming machine or subsequently during the assembly or use of the shielded thermoformed article or may cause holes in the EMI shield if the air pockets burst. The resulting processing problems, assembly problems with attendant waste of material are thus avoided by use of the add-on EMI shielding sheets of the invention. Further, such entrapment of gases disrupts heat transfer through the thermoformable article, causing a lack of processing control and resultant forming problems.

The invention is further understood by reference to the following non-limiting examples.

EXAMPLES

Example 1

A multiplicity of metal fibers having diameters of approximately 76 microns were continuously formed by forcing molten metal through a die having eight collinear orifices spaced 1.27 cm apart. These fibers were made from a low melting alloy, available as "Eutectic Belmont Alloy 2581" from Belmont Metals Inc, Brooklyn, N.Y., having a composition of 42 wt % tin (Sn) and 58 wt % bismuth (Bi). The melting onset temperature of this alloy was 139° C. The alloy was melted in a stainless steel pressure vessel at 200° C. and pressurized with pure nitrogen at approximately 207 kPa (kilopascals) above atmospheric pressure at the die. Metal fibers were formed and cooled by allowing the molten strands exiting the die to fall vertically for a distance of about 1.5 meters into a stream of horizontally formed melt blown fibers. The approximate web weight of the metal fibers was 602.8 g/m$^2$ and the polymer web had a weight of 187.0 g/m$^2$.

The polymer melt blown fibers were made from an ethylene/vinyl acetate resin, available as "Vynathene EY 902-35" from Quantum Chemical Corp., USI Div., Cincinnati, Ohio. The metal fibers intermingled with the air blown microfibers within the microfiber air stream and the composite fiber mat was collected. A section of this composite web was pressed at 7.26×10$^3$ kPa and at a temperature of 45° C. for 30 seconds in a heated platen press between sheets of release paper. This composite sheet was removed from the press and cut into a 20 cm square.

A 30 cm square sheet of 0.254 cm thick ABS, available as "Royalite R-59" from Royalite Thermoplastics Division, Polycast Technology Corporation, Mishawaka, IN, was placed into the clamping frame of a thermoformer. The bottom heater of the lab thermoformer was set at 371° C. and the top heater was set at 315° C. The ABS sheet was withdrawn after a preheating exposure time of 2 minutes and the section of the invention described above was laid onto the sheet. The ABS sheet with the composite sheet of the invention was placed back between the heating panels of the thermoformer for 15 seconds. After heating, a finished article, which was now laminated, was removed from between the heaters and pressure formed with a vacuum assist into a cylindrical bowl shape. The bowl had a diameter of approximately 14.8 cm and a depth of 6.2 cm. This resulted in a draw ratio, based on area, varying from about 200–300% over the thermoformed articles surface.

The bowl was clamped into a modified MIL-STD-285 test fixture. The thermoformed fibers covering the open end of the bowl were in electrical contact with the fixture base plate which also made up the ground plane of a 5.22 cm long emitting monopole antenna. An EMCO Model 3146 log periodic antenna was used as a receiving antenna. The distance between the receiving antenna and the emitting antenna within the sample bowl was approximately 30 cm. The signal source, which consisted of a Fluke Model 6060B frequency generator, was connected to the emitting antenna in the test fixture through an Amplifier Research Model 1W1000 amplifier. The signal from the receiving antenna was fed directly into a Hewlett Packard Model 8566B Spectrum Analyzer. The test bowl was placed over the monopole antenna and fastened to the ground plane using 12 screws at about 4.6 cm center to center spacing. Using this technique, it was found that the vacuum formed bowl provided EMI shielding of from 30–50 dB throughout the frequency range of 30 MHz to 1 GHz.

Example 2

A mat formed from approximately 76 micron diameter, low melting alloy metal fibers was formed by forcing molten metal through a die as described in Example 1. The fibers were collected on a flat surface in a loose mat approximately 1.25 cm thick (approximately 409 g/m$^2$).

A nonwoven polymer web was made from ethylene/vinyl acetate, available as "UL 7520" from Exxon Chemical Co., Houston, Tex., having an approximate web weight of 145.3 g/m$^2$. The metal fiber mat and the nonwoven polymer mat were then heat pressed at about 70° C. in the heated platen press at 8.11×10$^3$ kPa for 30 seconds. The resulting composite sheet was removed from the press and then cut into a 20 cm square.

This example of the invention was applied to a 30 cm square sheet of 0.254 cm thick ABS, Royalite R-59 thermoformable sheet, which had been preheated for two minutes in a thermoforming machine as described in Example 1. The two were laminated into a final article, and removed from between the heaters after 30 seconds. The thermoformable article was then pressure-formed with vacuum assist into a cylindrical bowl shape. The bottom of the bowl was cut out of the thermoformed article. The draw ratio of this portion of the bowl varied from 200 to 250% over the 14 cm diameter flat specimen. This specimen was then tested as to its far field EMI shielding characteristics using a National Bureau of Standards type (NBS) flanged coaxial test fixture. The signal source, which consisted of a Fluke Model 6060B frequency generator, was fed into the test fixture through an Amplifier Research Model 1W1000 amplifier. A 3 dB attenuator pad was used at the input to the test fixture and a 6 dB attenuator pad at the output. The output signal, from the test fixture, was fed into a Hewlett Packard Model 8566B Spectrum Analyzer. This specimen exhibited a far field shielding effectiveness of from 45 to 65 dB in the frequency range of 30 MHz to 1 GHz.

Example 3

A plurality of metal fibers each having a diameter of approximately 76 microns was formed from a low melting alloy by forcing molten metal through a die as described in Example 1. The fibers were collected in a loose mat approximately 1.8 cm thick (782.6 g/m$^2$) on the surface of a nonwoven polymer web having a weight of about 205.4 g/m$^2$. The nonwoven web was made from "Evathene EA 89822", available from Quantum Chemical. A 50 micron thick film made from DOW DAF 919 was placed on top of the metal fiber mat to sandwich it between the Evathene nonwoven web and the DOW 919 material. The resulting laminate was then pressed at about 80° C. in the heated platen press at 7.63×10$^3$ kPa for 30 seconds. The composite sample was then cut into a 20 cm square sheet and placed on top of a 30 cm square sheet of 0.254 cm thick Royalite R-59 thermoformable sheet which had been fastened into the clamp frame of a thermoforming machine. It was laid onto the ABS sheet with the Evathene covered side facing the ABS to act as a tie layer and the DAF 919 material out to electrically isolate the conductive. shielding layer. The ABS sheet and article of the invention were then heated together in the thermoforming machine for a total of 2½ minutes, removed from between the heaters and vacuum formed into a cylindrical bowl shape as described in Example 1. The bottom of the bowl was removed and then tested as to its far field shielding characteristics as described in Example 2 and was found to exhibit EMI shielding of from 45–65 dB throughout the frequency range of 30 MHz to 1 GHz.

Example 4

A mat (1065.8 g/m$^2$) of low melting alloy metal fibers approximately 76 micron in diameter was formed by forcing molten metal through a die as described in Example 1. The fibers were collected in a loose mat approximately 2.2 cm thick on the surface of a polymer web made from a 100 micron thick film consisting of a blend of ethylene-vinyl acetate resins, available as Bynel™ CXA 1025 from DuPont, Inc., Wilmington, Del. The resulting laminate was then pressed at about 77° C. in a heated platen press at 8.47×10$^2$ kPa for 45 seconds. The resulting sample was then cut into a 20 cm square sheet. This sheet was then perforated with 0.25 mm diameter holes 2 mm on center.

This example of the invention was applied to a 30 cm square sheet of 0.254 cm thick Royalite R-59 thermoformable sheet after the ABS sheet had been preheated for two minutes in the thermoforming machine as described in Example 1. They were then heated together in the thermoforming machine for an additional 30 seconds. The resulting article was then removed from between the heaters and vacuum formed into a cylindrical bowl shape as described in Example 1. The bowl was tested as to its shielding characteristics as described in Example 1, and was found to exhibit EMI shielding of from 35–50 dB throughout the frequency range of 30 MHz to 1 GHz.

Comparative Example 5C

A mat (747.8 g/m$^2$) of low melting alloy metal fibers approximately 76 micron in diameter was formed by forcing molten metal through a die as described in Example 1. The fibers were collected on the surface of a polymer web made from a 37 micron thick film of "Kodar PETG", available as PETG 6763 from Eastman Chemical Products Inc., Kingsport, Tenn. A piece of this laminate was then placed onto the surface of two separate sheets of film made from a 50% by weight blend of ethylene-vinyl acetate resins (Bynel CXA 1025 and Bynel CXA 3101 respectively, available from DuPont, and the entire composite was pressed in a heated platen press at a temperature of 130° C. for about 40 seconds under a pressure of about 750.9 kPa. This resulted in sheets having metal fibers pressed into the outside PETG surface of laminated PETG/CXA blend film, each having a total thickness of just under 0.75 mm. Both sheets were cooled to room temperature and then cut into 20 cm square sheets.

One of these samples was then centered on top of a 30 cm square sheet of 0.254 cm thick Royalite R-59 thermoformable sheet, with the CXA side down toward the ABS. The sample was then laminated to the ABS sheet, prior to the thermoforming operation, without entrapping substantial air between the two sheets in a heated platen press at 77° C. under a pressure of 9.37×10$^2$ kPa for about 15 seconds. The article, consisting of the prelaminated sample and the ABS sheet, were then clamped into the thermoforming machine and heated for 3 minutes. The top heater of the thermoforming machine was set at 315° C. and the bottom heater at 371° C. The resulting laminate was then removed from between the heaters and vacuum formed into a cylindrical bowl shape as described in Example 1. The bowl was tested as to its shielding characteristics as previously described and was found to exhibit EMI shielding of from 40–60 dB throughout the frequency range of 30 MHz to 1 GHz.

The second sample was applied as an add-on sheet during the thermoforming operation to a 30 cm square sheet of 0.254 cm thick Royalite R-59 thermoformable sheet, CXA side down toward the ABS. The ABS had been preheated for two minutes in a thermoforming machine as described in Example 1. The sample laminate was added onto the top of the ABS sheet and the heating continued in the thermoformer. The resulting article was then removed from between the heaters after an additional one minute. The article was then pressure formed with vacuum assist into a cylindrical bowl shape.

Because of the lack of porosity of the add-on EMI shielding sheet, relatively large pockets of air were trapped between the carrier material and the ABS substrate when this sample material was used as an add-on sheet in the manner of the invention. This entrapped air caused gross cosmetic problems (i.e. deformities) in the outer surface of the formed object, particularly at the corners, due to the thermal transfer abnormalities resulting from the air pockets. Further, the entire metal matrix broke apart into discontinuous islands during the thermoforming operation when using the thick, non-porous carrier material.

The bowl was tested as to its shielding characteristics as described in Example 1. Because of the many electrical discontinuities in the metal mat, it was found to exhibit virtually no EMI shielding throughout the frequency range of 30 MHz to 1 GHz.

Example 6

A mat of low melting alloy metal fibers was formed as described in Example 2. This mat (approximately 597.8 g/m$^2$) was placed on top of a nonwoven polymer web (having an approximate web weight of 126 g/m$^2$) made from ethylene methacrylic acid, available as Nucrel 960 EMMA from DuPont. These layers were placed on top of a nonwoven web of Evathene EA 89822. The Nucrel side of the metal/Nucrel composite was placed in contact with the Evathene layer. The purpose of the Evathene was to act as an adhesion promoting layer to the substrate polymer. This laminate was then pressed at about 77° C. in the heated platen press at 6.43×10$^2$ kPa for 45 seconds and then cut into a 20 cm square sheet.

This example of the invention was applied, Evathene side down, onto the surface of a 3.175 mm thick polycarbonate sheet, available as Lexan™ 9034 from General Electric Co., General Electric Plastics Div., Pittsfield, Mass.). The article was then heated in the thermoforming machine for three minutes. The top heater was set at 371° C. and the bottom heater was set at 427° C. The final laminated article was then removed from between the heaters and vacuum formed into a cylindrical bowl shape as described in Example 1. The bowl was tested as to its shielding characteristics as previously described and was found to exhibit EMI shielding of 20–45 dB throughout the frequency range of 30 MHz to 1 GHz.

Example 7

A mat (651.1 g/m$^2$) of low melting alloy metal fibers approximately 76 micron diameter was formed by forcing molten metal through a die as described in Example 1. The fibers were collected in a loose mat approximately 1.7 cm thick on the surface of a 50 micron thick extruded UL 7520 film. The resulting article was then pressed at about 77° C. in the heated platen press at 1.00×10$^3$ kPa for 45 seconds. The resulting sample was then cut into a 20 cm square sheet.

This example of the invention was applied to a 30 cm square sheet of 0.254 cm thick Royalite R-59 thermoformable sheet after the ABS sheet had been preheated in the thermoforming machine as described in Example 1. The ABS sheet and invention, which was now laminated to the ABS sheet, were then removed from between the thermoformers heaters after an additional 30 seconds exposure and vacuum formed into a cylindrical bowl shape as described in Example 1. The bowl was tested as to its shielding characteristics as described in Example 1 and was found to exhibit EMI shielding of 40–60 dB throughout the frequency range of 30 MHz to 1 GHz.

What is claimed is:

1. A thermoformable add-on EMI shielding sheet comprising a carrier material selected from the group consisting of polymeric fibrous webs and sheet materials having the capability of becoming porous during a thermoforming process, said carrier material having a metal mat at least partially embedded therein, said mat comprising a plurality of fine, randomly-oriented metal fibers, said carrier material having a softening temperature and said metal mat having a melting temperature lower than the highest temperature reached during said thermoforming process.

2. A thermoformable add-on EMI shielding sheet according to claim 1 wherein said carrier material is porous prior to said thermoforming process.

3. A thermoformable add-on EMI shielding sheet according to claim 1 wherein said carrier material is a polymeric nonwoven web.

4. A thermoformable add-on EMI shielding sheet according to claim 3 wherein said polymeric nonwoven web comprises blown fibers.

5. A thermoformable add-on EMI shielding sheet according to claim 3 wherein said metal fibers are entangled with said polymeric nonwoven web.

6. A thermoformable add-on EMI shielding sheet according to claim 3 wherein said carrier material comprises at least one polymeric non-woven material selected from the group consisting of polyethylene, ethylene-butyl acrylate copolymers, ethylene-vinyl acetate copolymers, ethylene-methacrylic acid copolymers, thermoplastic polyesters, and mixtures thereof.

7. A thermoformable add-on EMI shielding sheet according to claim 1 wherein said carrier material is nonporous at room temperature, and becomes porous during said thermoforming process.

8. A thermoformable add-on EMI shielding sheet according to claim 1 wherein said carrier material is rendered porous by mechanical means.

9. A thermoformable add-on EMI shielding sheet according to claim 7 wherein said carrier material comprises a polymeric film having mechanically created pores of up to 1 cm in size, said pores being spaced up to 2 cm when measured from center to center.

10. A thermoformable add-on EMI shielding sheet according to claim 1 wherein said metal mat comprises metal fibers selected from the group consisting of tin, lead bismuth, cadmium, indium, gallium, zinc, mixtures thereof, and alloys thereof.

11. A thermoformable article comprising an add-on EMI shielding sheet according to claim 1, and a substrate polymer, said article having a thermoforming temperature higher than said melting onset temperature of said metal fibers.

12. A thermoformable article according to claim 11 wherein the metal fibers of said add-on EMI shielding sheet are entangled with said polymeric nonwoven web.

13. A thermoformable article according to claim 11 comprising a plurality of layers of carrier materials.

14. A thermoformable article according to claim 13 further comprising a plurality of metal mats.

15. A thermoformable article according to claim 11 wherein said substrate polymer is selected from the group consisting of polystyrene, cellulose acetate, cellulose-acetate-butyrate (CAB), cellulose propionate, acrylonitrile-butadiene-styrene polymers, polyethylene, ethylene-butene copolymers, ethylene-vinyl acetate copolymers, polypropylene, and propylene copolymers, poly(methylmethacrylate), methyl methacrylate-acrylonitrile copolymers, acrylic-modified poly(vinyl chloride), polycarbonates, poly(vinyl chloride-co-vinyl acetate), poly(vinyl chloride), polysulfones, polyethersulfones and polyamides.

16. A thermoformed article comprising a substrate polymer having an EMI shielding layer on a portion thereof, said portion being less than the entire article, said shielding layer having been precut from an add-on EMI shielding sheet, placed atop said substrate polymer, and thermoformed therewith.

17. A thermoformed article made by a method comprising the steps of:

a) providing a polymeric substrate having an area where EMI shielding is desired;

b) preheating said polymeric substrate for sufficient time for it to attain some portion of its thermoforming temperature;

c) forming an article by placing a precut add-on EMI shielding sheet comprising a carrier material, including its metal mat, over said area where EMI shielding is desired;

d) heating said article for a sufficient time for said carrier material to soften and said metal mat to melt and for said article, including the polymeric substrate to reach completely its thermoforming temperature;

e) thermoforming said article into a desired shape.

18. A thermoformed article made by a method comprising the steps of:

a) providing a polymeric substrate having an area where EMI shielding is desired;

b) forming an article by placing a precut add-on EMI shielding sheet comprising a carrier material including its metal mat over said area where EMI shielding is desired;

c) heating said article for a sufficient time for said carrier material to soften and said metal mat to melt and for said article to reach completely its thermoforming temperature;

d) thermoforming said article into a desired shape.

19. A thermoformable add-on EMI shielding sheet according to claim 10 wherein said metal mat comprises metal fibers selected from the group consisting of alloys of tin, lead, bismuth, cadmium, indium, gallium, and zinc wherein said alloys contain at least one element selected from the group consisting of antimony, aluminum, copper, silver, gold, nickel, cobalt and iron.

* * * * *